United States Patent
de Jong et al.

(10) Patent No.: US 7,515,452 B1
(45) Date of Patent: Apr. 7, 2009

(54) INTERLEAVED MEMORY CELL WITH SINGLE-EVENT-UPSET TOLERANCE

(75) Inventors: Jan L. de Jong, Cupertino, CA (US); Susan Xuan Nguyen, Fremont, CA (US); Raymond C. Pang, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 122 days.

(21) Appl. No.: 11/649,447

(22) Filed: Jan. 3, 2007

(51) Int. Cl.
*G11C 11/00* (2006.01)

(52) U.S. Cl. .......................... 365/54; 365/156; 365/63

(58) Field of Classification Search ................. 365/154, 365/156, 63; 257/530
See application file for complete search history.

(56) References Cited

U.S. PATENT DOCUMENTS

| | | | |
|---|---|---|---|
| 4,782,467 A | 11/1988 | Belt et al. | |
| 5,570,313 A | 10/1996 | Masson et al. | |
| 6,570,206 B1 * | 5/2003 | Sakata et al. | 257/296 |
| 6,573,773 B2 * | 6/2003 | Maki et al. | 327/200 |
| 6,806,525 B2 * | 10/2004 | Takeuchi et al. | 257/296 |
| 7,111,215 B1 * | 9/2006 | Keller et al. | 714/725 |
| 7,139,190 B1 * | 11/2006 | de Jong | 365/154 |
| 2006/0056220 A1 | 3/2006 | Roche et al. | |

OTHER PUBLICATIONS

Velazco, R. et al., "Two CMOS Memory Cells Suitable for the Design of SEU-Tolerant VLSI Circuits", IEEE Transactions on Nuclear Science, Dec. 1994, pp. 2229-2234, vol. 41, No. 6, available from IEEE, 3 Park Avenue, 17th Floor, New York, NY 10016-5997.
U.S. Appl. No. 11/649,448 filed Jan. 3, 2007, De Jong, Jan L., et al., Xilinx, Inc. 2100 Logic Drive, San Jose, CA 95124.

* cited by examiner

*Primary Examiner*—Son Dinh
(74) *Attorney, Agent, or Firm*—Scott Hewett

(57) ABSTRACT

A memory array has a first memory cell with a plurality of transistors connected so as to restore a data value to a node of the memory cell to an initial value following an event upsetting the initial value. A first portion of the plurality of transistors is in a first cell portion and a second portion of the plurality of transistors is in a second cell portion. A second memory cell has a third cell portion and a fourth cell portion. The third cell portion is between the first cell portion and the second cell portion and adjacent to each of the first cell portion and the second cell portion. In a particular embodiment, the memory cell is a single-event-upset ("SEU") tolerant memory cell and the first and second cell portions are each a half cell of a sixteen transistor memory cell.

12 Claims, 6 Drawing Sheets

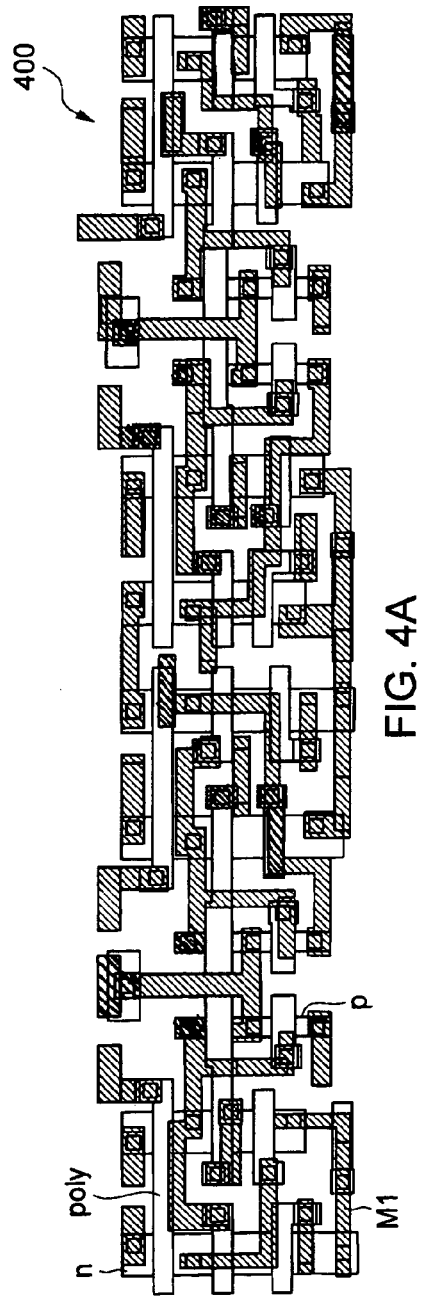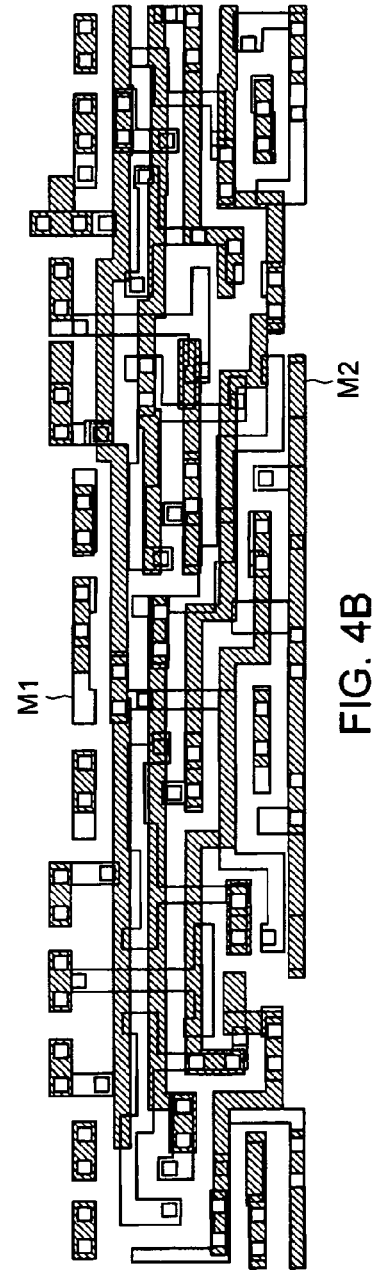
FIG. 4A
FIG. 4B

INTERLEAVED MEMORY CELL WITH SINGLE-EVENT-UPSET TOLERANCE

FIELD OF THE INVENTION

This invention relates generally to complementary metal-oxide-semiconductor ("CMOS") memory cells and more particularly to memory cells tolerant to high energy particle ("ion") hits.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

Two basic approaches to improve SEU tolerance have been tried. One approach is commonly called "resistive hardening;" however, resistive hardening can significantly degrade latch performance. Another disadvantage arises if a standard CMOS fabrication has to be modified to accommodate a resistively hardened IC. It is highly desirable that SEU tolerant ICs be made using standard CMOS fabrication processes.

Another approach to improve SEU tolerance is commonly called "design hardening." Design hardening generally refers to laying out a memory cell or other circuit to improve recovery of data after ion hits. A general discussion of design hardening is found in the paper entitled Two CMOS Memory Cells Suitable for the Design of SEU-Tolerant VLSI Circuits, by Velazco et al., IEEE Transactions on Nuclear Science, Vol. 41, No. 6 (December 1994), the disclosure of which is hereby incorporated by reference in its entirety for all purposes.

In design hardening, redundant storage bits are located apart from each other, maintaining a source of initial data after an SEU upsets one of the storage bits. Many variations are known, using sixteen-, fourteen- and twelve-transistor SEU tolerant memory cells.

FIG. 1 is a circuit diagram of a prior art sixteen-transistor SEU tolerant memory cell 150. As used herein, "sixteen-transistor memory cell" refers to the twelve storage devices N1, N2, N3, N4, N5, N6, N7, N8, P1, P2, P3, P4 and the four access devices T1, T2, T3, T4. Those of skill in the art of SEU resistant memory cells appreciate that the number of access devices is not always included in the transistor count or shown in a memory cell circuit diagram.

FIG. 9 of U.S. Pat. No. 6,573,773 B2 by Maki et al. ("Maki"), the disclosure of which is hereby incorporated in its entirety for all purposes, shows a radiation tolerant storage cell that is similar in operation to the memory cell 150 shown in FIG. 1, above. However, access transistors are not shown in FIG. 9 of Maki. The operation of the radiation tolerant storage cell of FIG. 9 described in Maki is substantially similar to the operation of the memory cell 150 of FIG. 1, above. Therefore, a detailed description of the operation of the memory cell 150 of FIG. 1 is omitted because the operation of the memory cell 150 will be familiar to those of skill in the art.

The memory cell circuit 150 has data terminals d, $d_b$ ("data BAR"), output terminals Q, $Q_b$, and internal nodes 152, 154 that store values $QQ_b$ and QQ, respectively. A data value is a digital zero or digital one value, and the bar value is the opposite value. For example, if Q=1, then $Q_b$=0. QQ saves a redundant value of Q, and $QQ_b$ saves a redundant value of $Q_b$. The values stored at the nodes are utilized in restoring the state of the memory cell if a node is upset by an SEU.

Since QQ has the same value of Q, and $QQ_b$ has the same value of $Q_b$, other nodes could be used for the outputs of the memory cell 150. For example, instead of Q and $Q_b$ being the nodes that are output, as shown in FIG. 1, the outputs could be nodes QQ and $Q_b$, nodes Q and $QQ_b$, or nodes QQ and $QQ_b$. Furthermore, in a memory array having several similar memory cells defined in the silicon layer, some memory cells in the array may interface to other portions (circuits) of an IC through nodes Q and $Q_b$, and other memory cells may interface to other portions or the IC through nodes QQ and $Q_b$, for example.

Redundant data storage nodes are used for storing information. If data stored in one node is changed by an ion hit, the redundant node restores the other node to its initial value (state). This protects the data stored in the memory cell from ion hits as long as the data values stored in both of the redundant nodes are not simultaneously changed by an ion hit. It is desirable to physically separate redundant nodes to avoid both nodes from being affected by a single ion hit.

An ion hit creates charge in the silicon of the memory cell. This charge can upset the data value stored at a node by changing the voltage at that node. As the devices used in memory cells shrink, the amount of charge required to upset a stored data value also decreases. Charge is generated about a radius of the path of the ion. Although this charge radius depends on the energy of the ion, it is generally desirable to separate redundant nodes in SEU tolerant memory cells by at least one micron.

As the design technology decreases for IC production, a memory cell layout appropriate for a larger technology design dimension (e.g., 90 nm technology) might not provide adequate SEU tolerance when reduced to a smaller design dimension (e.g., 65 nm technology) product. For example, an SEU tolerant cell layout that provides sufficient spacing between redundant nodes in a 90 nm design might provide insufficient spacing when reduced to a 65 nm design.

Therefore, memory cells suitable for small geometry (small design technology) ICs that provide SEU tolerance is desirable.

SUMMARY OF THE INVENTION

A memory array has a first memory cell with a plurality of transistors connected so as to restore a data value to a node of the first memory cell to an initial value following an event upsetting the initial value. A first portion of the plurality of transistors is in a first cell portion and a second portion of the plurality of transistors is in a second cell portion. A second memory cell has a third cell portion and a fourth cell portion. The third cell portion is between the first cell portion and the second cell portion. In a particular embodiment, the memory cell is a single-event-upset ("SEU") tolerant memory cell, and the first and second cell portions are each a half cell of a sixteen transistor memory cell.

DESCRIPTION OF THE DRAWINGS

FIGS. 4A-4D show various patterned layers of a memory cell according to an embodiment of the invention.

DETAILED DESCRIPTION

Figure 2:
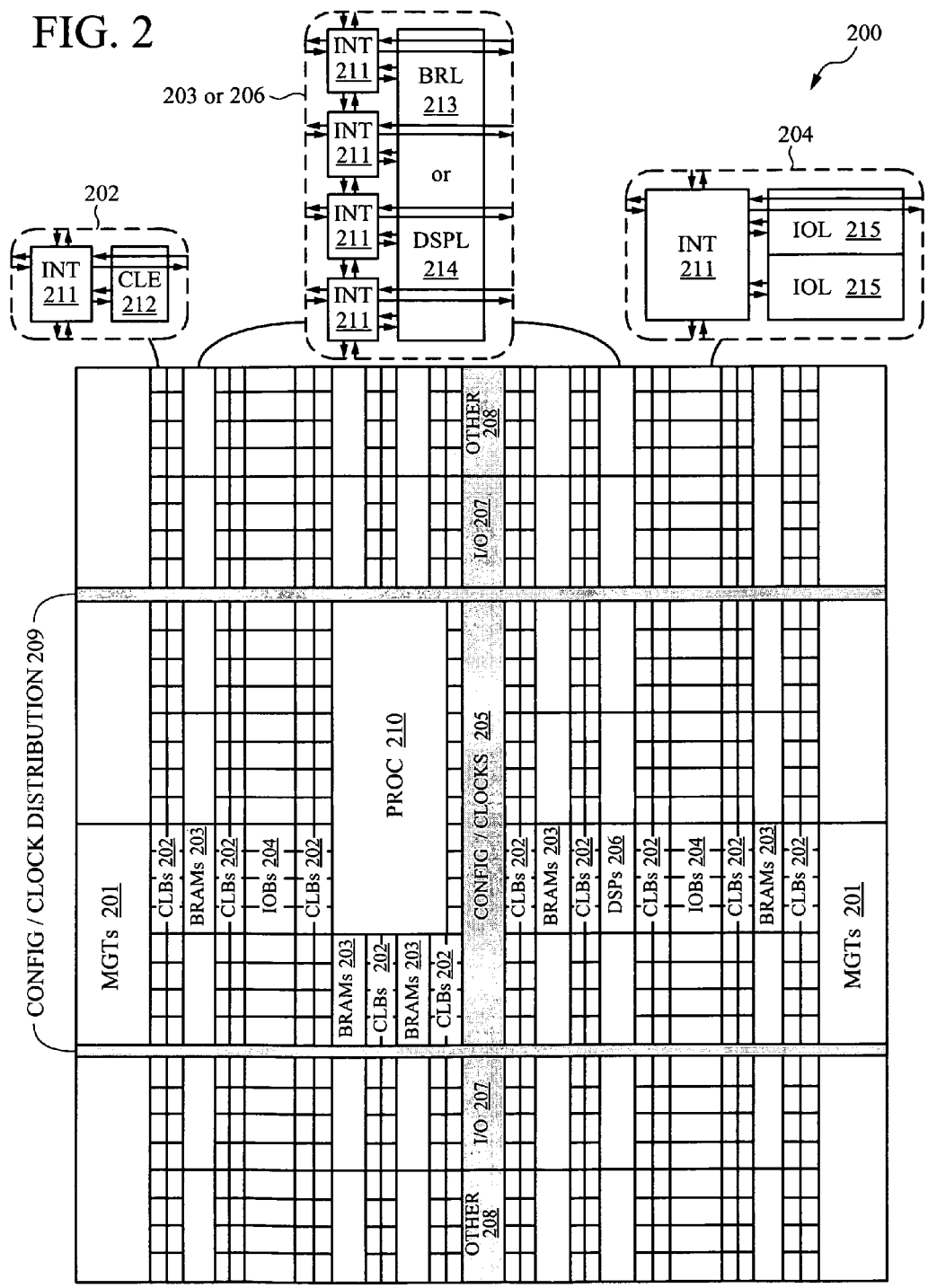
FIG. 2 is a plan view of an FPGA architecture suitable for implementing embodiments of the invention.

FIG. 2 illustrates an FPGA architecture 200 suitable for implementing embodiments of the invention. The FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200. For example, SEU-tolerant memory cells and memory arrays are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors. Non-correcting, six-transistor memory cells are suitable for many applications in an FPGA.

Configuration memory is particularly susceptible to SEU because error code correction techniques cannot be used, and an error in configuration memory can change the functionality of a block in the FPGA. In a particular embodiment, the FPGA 200 is fabricated using a technology design less than 90 nm. It is particularly challenging to provide SEU tolerant memory for small technology designs because as the design technology decreases, the separation between nodes of a memory cell decreases. The amount of charge needed to upset a data value stored at a node also typically decreases. Interleaved memory cells have separation between redundant nodes to provide high SEU tolerance, even in small technology designs.

Figure 3A:
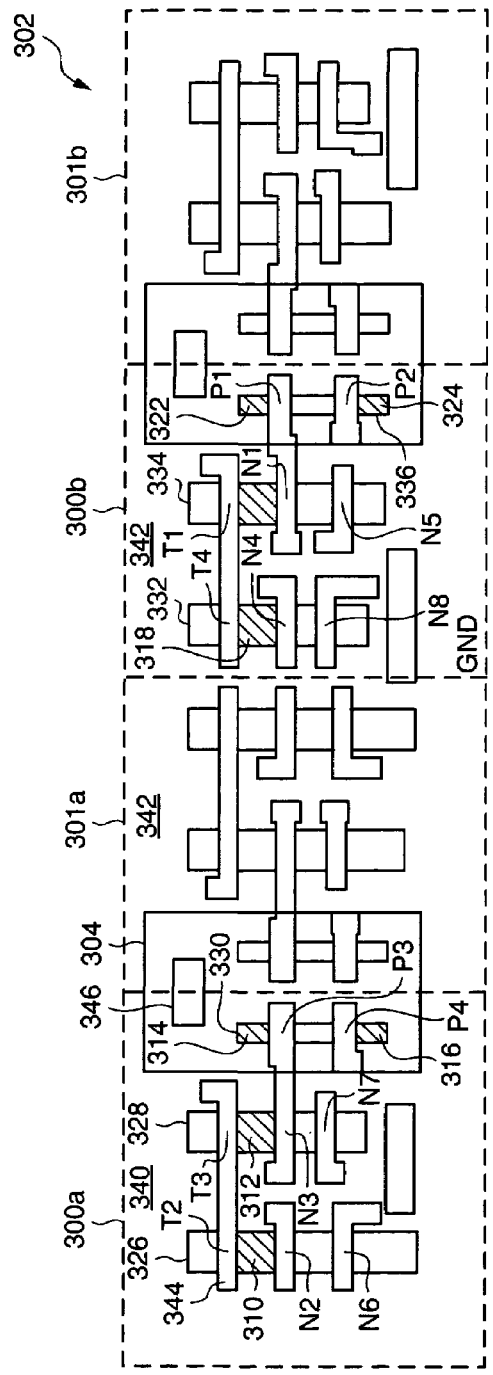
FIG. 3A is a layout of an SEU tolerant memory cell according to an embodiment of the invention.

FIG. 3A is a plan view of a portion of a row of a memory array 302 with interleaved memory cells according to an embodiment of the invention. A first memory cell includes a first cell portion 300*a* and a second cell portion 300*b*. The first memory cell is an SEU tolerant memory cell having a plurality of transistors connected so as to restore a data value to a node of the memory cell to an initial value following an event upsetting the initial value. The first memory cell is interleaved with a second memory cell that has a first cell portion 301*a* and a second cell portion 301*b*. "Interleaved" means that a portion of one memory cell (e.g., portion 301*a* of the second memory cell) is physically laid out between and adjacent to portions of another memory cell (e.g., portions 300*a* and 300*b*) in a row of a memory array. As used herein, "adjacent" means that one portion of a memory cell is in the same row or column as the other portion of the memory cell. In FIG. 3A, the first cell portion 300*a* has a first portion of the plurality of transistors and is adjacent to and shares a common edge with the interleaved cell portion 301*a*, which is adjacent to and shares a common edge with the second cell portion 300*b*. The second cell portion has a second portion of the plurality of transistors. There are various ways to electrically connect the transistors of the memory cell of FIG. 3A, and the circuit indicated in FIGS. 3A and 3B is merely exemplary for purposes of discussion.

Conventional memory cells are laid out in a non-interleaved fashion, which simplifies electrical interconnecting the various elements (e.g., FETs) of the memory cell. Interleaving complicates electrically interconnecting one half cell with another (e.g., 300*a*, 300*b*) because the interconnections (which would be four interconnections in the example of FIG. 3A) cross the intervening half cell (e.g., 301*a*) of another memory cell. Similarly, the interconnections for the intervening half cell (e.g., 301*a*) cross over a half cell (e.g., 300*b*). As used herein, the term "half cell" refers to an area of a substrate that defines a portion of a memory cell. In some embodiments, the half cells have equal numbers of transistors, such as the eight transistors T2, T3, N2, N3, N6, N7 in half cell 300*a* and the eight transistors T4, T1, N4, N1, N8, N5 in half cell. The half cells are substantially identical to one another; however, this is not essential in all embodiments.

Figure 3B:
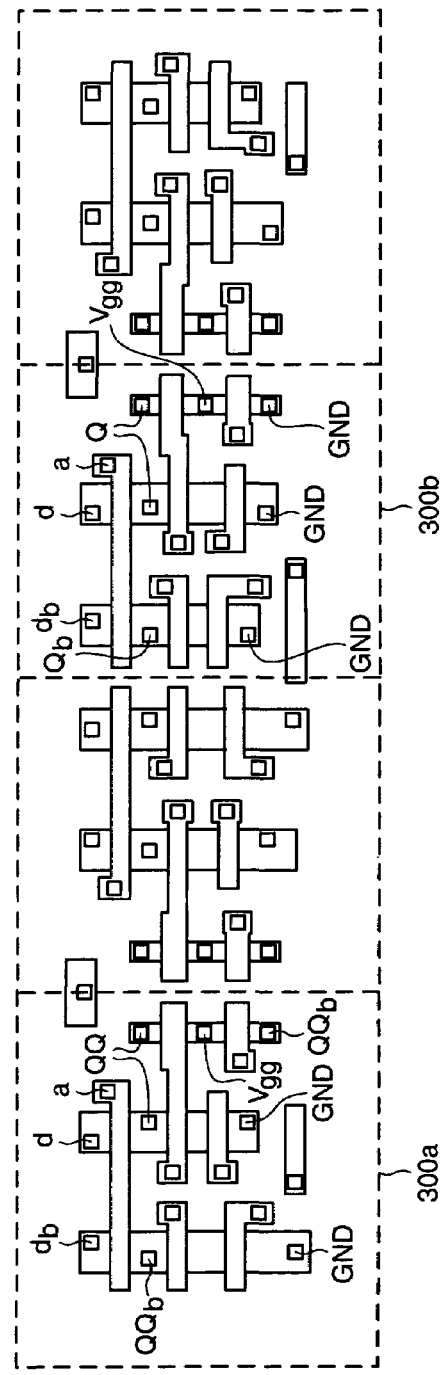
FIG. 3B shows the memory cell of FIG. 3A with indicators corresponding to the circuit diagram of FIG. 1.

Node target areas 310, 312, 314, 316, 318, 320, 322, 324 of diffusions 326, 328, 330, 332, 334, 336 are areas of the wafer that are particularly susceptible to ion hits because these node target areas are connected to the nodes Q, $Q_b$, QQ, $QQ_b$ (compare FIG. 3B). Node target areas 310, 312 are associated with NMOS devices $N_2$ and N3 in the first half cell 300*a*, and node target areas 318, 320 are associated with NMOS devices N4 and N1 in the second half cell 300*b*. It is desirable to separate redundant target areas by at least one micron. Since charge is more likely to accumulate on the node target areas associated with NMOS devices on a P-type substrate, which is the example of FIG. 3A, it is desirable in some applications to provide at least two microns of separation between these node target areas. In a particular embodiment of a memory array designed according to 65 nm technology, 2.8 microns of separation is provided between node target area 312 and node target area 318.

The diffusions are formed in well portions 340, 304, 342, 306. In a particular embodiment, the well portions 304, 306 are N-type wells ("N-wells") formed in a P-type substrate, and well portions 340, 342, as is commonly done in the art (see. e.g., U.S. Patent Application Publication No. 2006/0056220 A1, ¶¶s [0053]-[0055], the disclosure of which is incorporated by reference hereby in its entirety for all purposes). Alternative embodiments use N-type substrates with P-wells formed in the substrate. As used herein, the term "well" includes not only conventional wells formed in a silicon wafer or similar substrate, but also well-like structures formed on silicon-on-insulator ("SOI") substrates, for example.

Gate structures, such as gate structure 344, are polysilicon, silicide, or other material, and form a channel region in the diffusion 326, as is well known in the art. Since gate structures are very well known to those of ordinary skill in the art, not all gate structures are identified with a reference numeral in order to simplify and clarify the illustration. Similarly, contacts are not shown to improve the clarity of illustration, as contacts to gate structures, taps, wells, and other features are well known, and a variety of contact placements is possible (see FIG. 3B, showing contacts). It is commonly understood that an FET generally may have a gate contact, a source contact, and a drain contact, although in some instances, a source/drain contact is omitted for FETs in series (e.g., a contact is not necessary between N2 and N6 of diffusion 326, see also, FIG. 1). Whether a source/drain contact operates as a source or as a drain depends on the electrical connections made to the physical device. Calling such contacts "source/drain contacts" is well understood in the art. A contact may not always be necessary, for instance in cases where the gate, source, or drain region does not need to be connected to other parts of the circuit, or where they are connected, for example, by diffusion or poly routing.

Well taps ("taps") 345, 346 provide current paths for charge generated by ion hits, and are biased to form a P-N junction between the N-well 304 and the substrate/P-wells 340. In a particular embodiment, the P-taps are grounded, and the N-taps are biased to a supply voltage level (Vgg). An ion generates charge as it travels through the semiconductor material. An ion hitting an N-well would generate charge in the N-well material, as well as possibly in the semiconductor material (substrate) below the N-well.

However, the P-N junction between the N-well and the underlying P-type substrate inhibits ion-generated charge flow from the substrate into the N-well. In the P-well 340, the charge generated by an ion hit is not blocked, thus the NMOS devices (e.g., N2, N6) in the P-wells are more susceptible to being upset from an ion hit than are the PMOS devices (e.g., P3, P4) in the N-wells, and it is desirable to separate the NMOS devices further apart to provide SEU tolerance. In an embodiment having P-wells formed in an N-type substrate, it would be desirable to provide further separation between the PMOS devices than the NMOS devices for similar reasons.

Interleaving separates redundant nodes of an SEU tolerant memory cell to reduce the possibility that a single ion or other high-energy particle might simultaneously upset both nodes. It is generally desirable that at least one micron, and in some instances, at least two microns, separate critical areas of redundant nodes. Interleaving desirably separates redundant nodes of an SEU tolerant memory cell, even at design technologies less than 90 nm. Note that as design technologies continue to shrink, it may be desirable to interleave the redundant nodes of more than two memory cells in order to maintain a particular absolute separation between the nodes. For example, three memory cells may be interleaved to increase the spacing between redundant nodes by the width of an additional half cell.

The half cell 301a is essentially a mirror image of half cell 300a, and half cell 301b is essentially a mirror image of half cell 300b, which allows sharing of features, such as N-wells 304, 306 between cells. This simplifies layout and convenient stepping and repeating along a row of a memory array.

Figure 1:
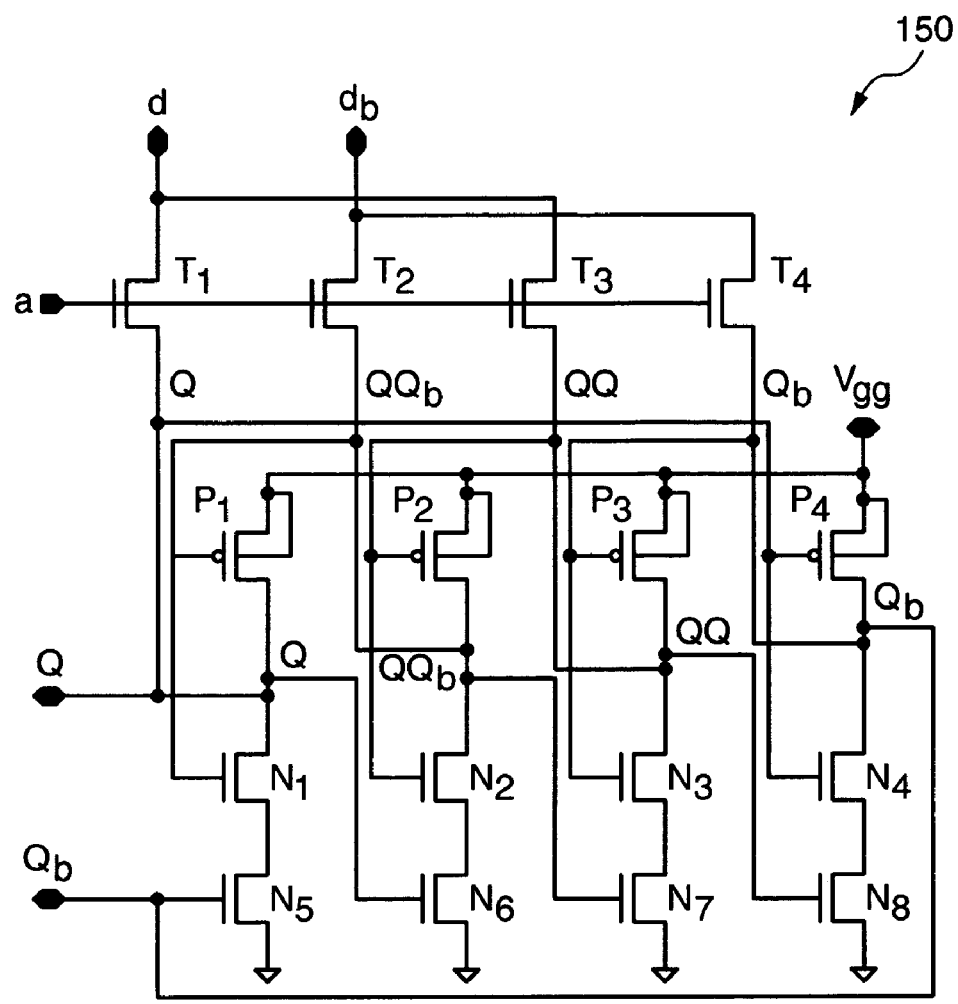
FIG. 1 is a circuit diagram of a prior art sixteen-transistor SEU tolerant memory cell.

FIG. 3B shows the memory cell of FIG. 3A with indicators corresponding to the circuit diagram of FIG. 1. First half cell 300a shows contacts, represented by small squares, connected to d, $d_b$, QQ$_b$, GND, 1, QO, and $V_{gg}$ and shown (compare to FIG. 1). Labels to some of the contacts of the gate structures are omitted for clarity of illustration, and are easily identified with reference to FIG. 1.

Figure 3C:
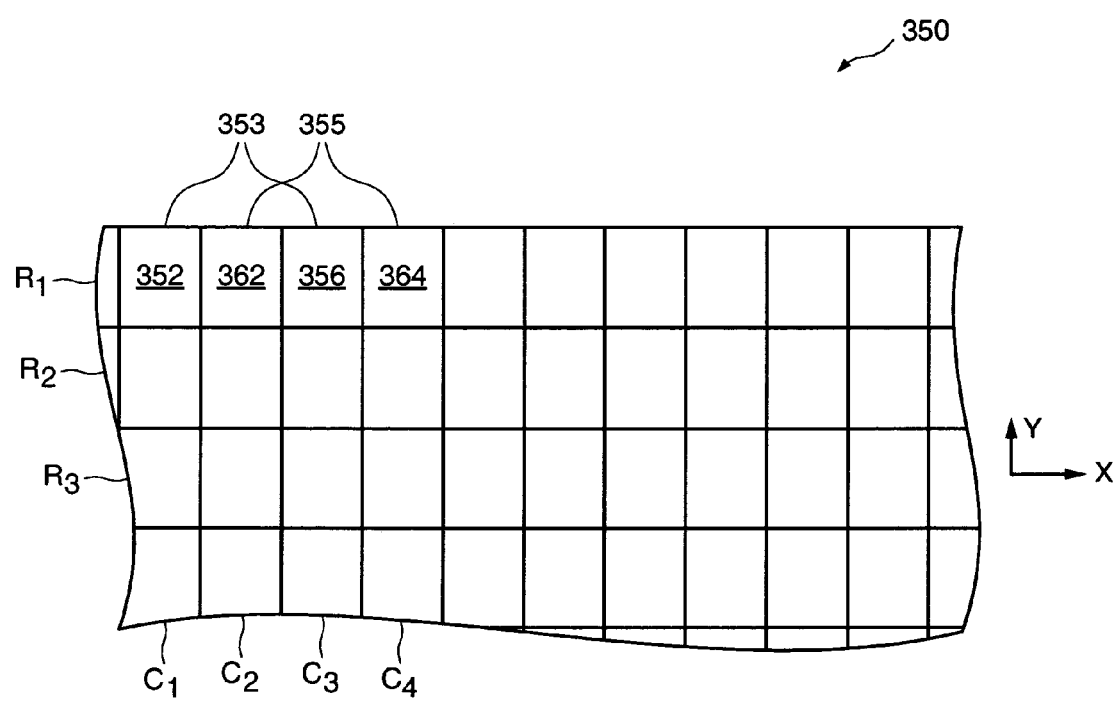
FIG. 3C is a plan view of a layout of memory cells in a portion of a memory array 350 according to an embodiment of the invention.

FIG. 3C is a plan view of a layout of memory cells in a portion of a memory array 350. The memory array 350 is arranged by rows and columns, as is known in the art. In a typical memory array, rows of SEU-tolerant memory cells R1, R2, R3 are arranged in columns C1, C2, C3, C4. In the memory array 350, a first half cell 352 in a first column C1 is electrically coupled to a second half cell 356 in column C3 to form an SEU tolerant memory cell 353. The first and second half cells 352, 356 are in the same row R1 of the memory array 350. A third memory half cell 362 in the row R1 is between and adjacent to both the first memory half cell 352 and the second memory half cell 356. The third memory half cell forms a second SEU tolerant memory cell 355 with a fourth half cell 364.

Interleaving the first and second half cells 352, 356 of the first SEU tolerant memory cell with a half cell 362 of a second SEU tolerant memory cell separates redundant node target areas (see FIG. 3B, above) to provide SEU tolerance without substantially increasing the area required on a substrate (chip) for an SEU tolerant memory array having a given memory capacity. In other words, the area required for the interleaved memory cells made of half cells 352 and 356, and half cells 362 and 364 does not require substantially more area than if the half cells were not interleaved. In some embodiments, the area might be slightly increased to provide cross-cell routing of electrical signals, particularly in embodiments having fewer metal layers available. Interleaved memory cell arrays are particularly desirable for small geometry technologies because in many instances they maintain adequate separation for SEU tolerance as the design shrinks, which brings critical node target areas closer together.

Although only four half cells (forming two SEU-tolerant memory cells) are shown in the memory array 350, those of skill in the art appreciate that interleaving can continue along a row, and that interleaved rows can be stepped and repeated in a vertical fashion to provide a memory array. Interleaving portions of memory cells can fully utilize each row and column of a memory array. That is, interleaving memory cells along a row forms a row of complete memory cells, there are no partial rows. Those of skill in the art appreciate that the term "row" is used solely for purposes of convenient discussion, and that FIG. 3C could be rotated ninety degrees so that the interleaved memory cells proceed in a vertical orientation.

It is generally desirable that one half cell of a memory cell is offset from the other half cell by at least one micron, and preferably two microns if some critical node target areas are in diffusions that provide a current path to or from the substrate (i.e., P-wells in a P-type substrate). In other words, the width (x-direction) of an interleaved half cell is at least one micron, and in a further embodiment is at least two microns. In a particular embodiment of memory array of interleaved sixteen-transistor memory cells designed according to 65 nm technology has 2.8 microns of separation between NMOS devices in the same cell (see FIG. 3A, ref. nums. 312, 318) and has 3.7 microns of separation between PMOS devices in the same cell (see FIG. 3A, ref. nums. 316, 336).

FIGS. 4A-4D illustrate how an interleaved sixteen-transistor SEU tolerant memory cell can be electrically connected through multiple patterned layers in an IC. Complex ICs, such as FPGAs, typically have a sufficient number of metal layers to electrically connect the interleaved half cells. Other embodiments, such as an interleaved twelve-transistor SEU tolerant cell, might be interconnected using fewer patterned metal layers.

Generally, memory cells are repeated in a memory array (see FIG. 3C). It is highly desirable to provide the electrical connections between terminals in each memory cell within the row of the memory array containing the half cells to allow stepping and repeating rows of memory cells and their associated wiring. Interleaved memory cells are difficult to electrically connect ("wire") in a single metal layer, particularly in ICs using design technology less than 90 nm, because there is not sufficient height (y-direction of the memory array) to run all the connecting traces back and forth between spaced-apart redundant storage devices and associated access devices (e.g., four connections cross an interleaved half cell in a sixteen-transistor SEU tolerant memory cell design).

Wiring between electrical terminals of an interleaved memory cell having sixteen transistors (refer to FIGS. 1, 3A, 3B) is shown in the following sequence of plan views. Wiring memory cells and multi-metal layer patterning, vias, contacts, and circuit connection is well known in the art of IC fabrication, thus an abbreviated description is provided.

FIG. 4A is a plan view of a memory cell 400 showing N-type diffusions ("n"), P-type diffusions ("p"), gate structures ("poly"), and the first metal layer M1. The gate structures are not limited to polysilicon or polysilicide. Some parts of the M1 layer are not connected to the underlying substrate (FIG. 4A), and will be used to route electrical paths from overlying patterned metal layers, as is well understood in the art. Not all features and structures are separately labeled for clarity of illustration, as such features are familiar to those of skill in the art. A layer of dielectric material (not shown), such as a layer of deposited $SiO_2$, is between the M1 layer and the substrate, and the contacts are formed through the dielectric material to electrically connect the M1 layer to the structures of the substrate.

Figure 4C:
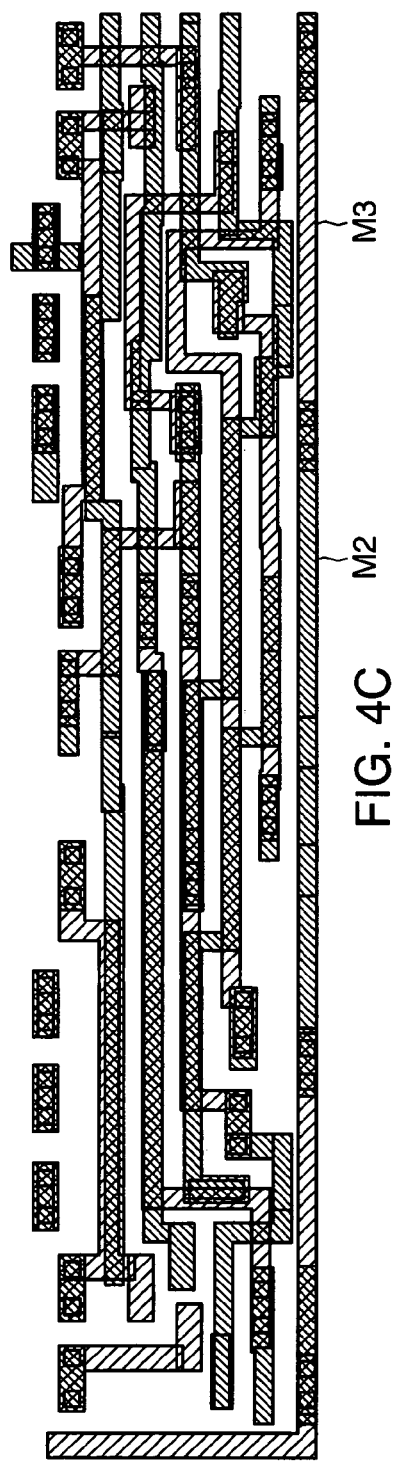
Figure 4D:
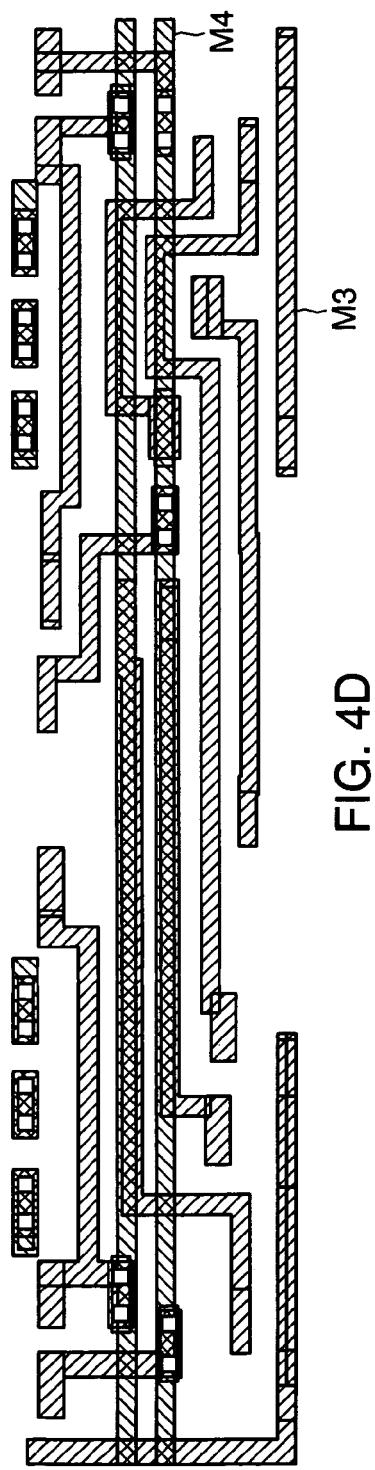

FIG. 4B is a plan view of the memory cell of FIG. 4A showing the M1 and M2 patterned metal layers. M1-to-poly contacts ("poly contact") are shown in both FIGS. 4A and 4B. A second dielectric layer (not shown) is formed between the M1 and M2 layers, and vias are formed through the second dielectric layer to electrically connect selected portions of the patterned M1 layer with selected portions of the patterned M2 layer. FIG. 4C shows a third patterned metal layer ("M3") over the M2 layer. A third dielectric layer (not shown) is formed between the M2 and M3 layers, and vias through the third dielectric layer electrically connect the patterned metal layers in the desired circuit configuration. FIG. 4D shows a fourth patterned metal layer ("M4") over the M3 layer. A fourth dielectric layer (not shown) is formed between the M3 and M4 layers, and vias through the fourth dielectric layer electrically connect the patterned metal layers in the desired circuit configuration.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A memory array comprising:
   a first memory cell having a plurality of transistors connected so as to restore a data value to a node of the first memory cell to an initial value following an event upsetting the initial value, a first portion of the plurality of transistors being in a first cell portion and a second portion of the plurality of transistors being in a second cell portion;
   a second memory cell having a third cell portion and a fourth cell portion, wherein the third cell portion is between the first cell portion and the second cell portion.

2. The memory array of claim 1 wherein the first memory cell and the second memory cell are within a row of the memory array.

3. The memory array of claim 1 wherein the first cell portion is a first half cell and the second cell portion is a second half cell.

4. The memory array of claim 3 wherein the first half cell includes a first plurality of eight transistors and the second half cell includes a second plurality of eight transistors.

5. The memory array of claim 3 wherein the third cell portion is a third half cell.

6. The memory array of claim 1 wherein the third cell portion is essentially a mirror image of either the first cell portion or of the second cell portion.

7. The memory array of claim 1 further comprising
   a first node target area associated with a first NMOS device in the first cell portion and
   a second node target area associated with a second NMOS device in the second cell portion, the first node target area being at least two microns from the second node target area.

8. The memory array of claim 7 wherein the memory array is laid out according to a design technology dimension less than 90 nm.

9. The memory cell of claim 7 wherein the memory array is laid out according to a 65 nm design technology dimension.

10. The memory cell of claim 1 wherein the memory cell is a configuration memory cell in a field programmable gate array.

11. The memory array of claim 1 wherein the third cell portion is adjacent to each of the first cell portion and the second cell portion.

12. The memory array of claim 1 further comprising a third memory cell having a fifth cell portion and a sixth cell portion, wherein the third cell portion and the fifth cell portion are between the first cell portion and the second cell portion.

* * * * *